(12) United States Patent
Lamanna et al.

(10) Patent No.: US 8,330,510 B2
(45) Date of Patent: Dec. 11, 2012

(54) DUAL PHASE DETECTOR PHASE-LOCKED LOOP

(75) Inventors: Pasquale Lamanna, Villeneuve-Loubet (FR); Nicolas Sornin, La Tronche (FR)

(73) Assignee: Cambridge Silicon Radio Limited, Cambridge (GB)

( * ) Notice: Subject to any disclaimer, the term of this patent is extended or adjusted under 35 U.S.C. 154(b) by 133 days.

(21) Appl. No.: 12/918,040

(22) PCT Filed: Mar. 5, 2009

(86) PCT No.: PCT/EP2009/052634
§ 371 (c)(1),
(2), (4) Date: Aug. 24, 2010

(87) PCT Pub. No.: WO2009/109640
PCT Pub. Date: Sep. 11, 2009

(65) Prior Publication Data
US 2010/0321075 A1    Dec. 23, 2010

(30) Foreign Application Priority Data

Mar. 7, 2008   (GB) .................................. 0804337.7

(51) Int. Cl.
*H03L 7/06* (2006.01)
(52) U.S. Cl. ........... 327/156; 327/157; 375/373; 331/11
(58) Field of Classification Search .................. 327/156, 327/159; 375/376; 331/1 R, 10, 11
See application file for complete search history.

(56) References Cited

U.S. PATENT DOCUMENTS

| | | | |
|---|---|---|---|
| 5,334,952 A | 8/1994 | Maddy et al. | |
| 5,663,688 A | 9/1997 | Delmas et al. | |
| 5,898,328 A | 4/1999 | Shoji | |
| 6,236,278 B1 | 5/2001 | Olgaard | |
| 6,515,525 B2 * | 2/2003 | Hasegawa | 327/156 |
| 6,744,323 B1 | 6/2004 | Moyal et al. | |
| 6,867,627 B1 * | 3/2005 | Murtagh | 327/158 |
| 2001/0052804 A1 * | 12/2001 | Hasegawa | 327/156 |
| 2002/0136341 A1 * | 9/2002 | Huh et al. | 375/376 |

(Continued)

OTHER PUBLICATIONS

Meninger et al., "A 1-MHz Bandwidth 3.6-GHz 0.18-um CMOS Fractional-N Synthesizer Utilizing a Hybrid PFD/DAC Structure for Reduced Broadband Phase Noise," IEEE Journal of Solid-State Circuits, Apr. 2006, pp. 966-980, vol. 41, No. 4, IEEE.

(Continued)

*Primary Examiner* — Ryan Jager
(74) *Attorney, Agent, or Firm* — Novak Druce DeLuca + Quigg LLP

(57) ABSTRACT

A phase-locked loop for generating an output signal that has a predetermined frequency relationship with a reference signal, the phase-locked loop comprising a signal generator arranged to generate the output signal, a charge pump arranged to generate current pulses for controlling the signal generator, two control units for controlling a duration of the current pulses generated by the charge pump and a selection unit arranged to select either the first control unit or the second control unit to control the charge pump, wherein a first one of the control units is arranged to continuously monitor a phase-difference between the reference signal and a feedback signal formed from the output signal and to, when selected by the selection unit, control the charge pump to output a current pulse having a duration that is dependent on that phase-difference and a second one of the control units is arranged to, when selected by the selection unit, control the charge pump to output a current pulse of predetermined duration that compensates for a phase error in the feedback signal.

22 Claims, 6 Drawing Sheets

U.S. PATENT DOCUMENTS

| | | |
|---|---|---|
| 2004/0232960 A1 | 11/2004 | Albasini et al. |
| 2005/0094757 A1 | 5/2005 | Meninger et al. |
| 2007/0126484 A1 | 6/2007 | Lin et al. |
| 2009/0207961 A1* | 8/2009 | Sai .............................. 375/375 |

OTHER PUBLICATIONS

Koo et al., "A Fully Integrated CMOS Frequency Synthesizer With Charge-Averaging Charge Pump and Dual-Path Loop Filter for PCS- and Cellular-CDMA Wireless Systems," IEEE Journal of Solid-State Circuits, May 2002, pp. 536-542, vol. 37, No. 5, IEEE.

Cassia et al, "Analytical Model and Behavioral Simulation Approach for a Pi Delta Fractional-N Synthesizer Employing a Sample-Hold Element," IEEE Transactions on Circuits and Systems—II: Analog and Digital Signal Processing, Nov. 2003, pp. 850-859, vol. 50, No. 11, IEEE.

* cited by examiner

DUAL PHASE DETECTOR PHASE-LOCKED LOOP

The invention relates to a phase-locked loop having a phase detector for determining a difference in phase between a reference signal and a feedback signal so that a signal generator can be controlled to output a signal having a predetermined frequency-relationship with the reference signal.

A phase-locked loop is a circuit that generates an output signal having a predetermined frequency and/or phase relationship with a reference signal. A typical phase-locked loop is shown in FIG. 1. The phase-locked loop comprises an oscillator 101 for generating a signal of fixed frequency and a phase/frequency detector (PFD) for comparing the fixed frequency signal (the reference signal) with a feedback signal output by a divider 107 located in feedback loop 106. The PFD is connected to a charge pump 103. The PFD outputs a signal to the charge pump that is representative of the phase and/or frequency difference between the feedback signal and the reference signal. The charge pump injects a current into a loop filter 104 in dependence on the signal it receives from the PFD. Typically, this current injection will take the form of either an "up" or "down" current generated by current sources 108 and 109 respectively, so that current flows either into or out of the loop filter. In other words, the PFD and charge pump act together to output either positive or negative charge "pulses" in dependence on whether the reference signal's phase leads or lags the feedback signal. The loop filter filters these charge pulses to generate a control signal for a signal generator 105.

The signal generator is typically a voltage-controlled oscillator (VCO) controlled by a tuning voltage at its control input. The loop filter is typically arranged to integrate the current pulses it receives from the charge pump to generate the tuning voltage necessary for controlling the VCO. If the feedback signal lags the reference signal, it is necessary to speed up the VCO. Conversely, if the feedback signal leads the reference signal, it is necessary to slow down the VCO.

The frequency of the signal output by the phase-locked loop can be changed by varying the frequency of the reference signal. Often, the reference signal is generated by a very stable oscillator whose frequency cannot be varied. Therefore, it can be beneficial to include a divider in the feedback loop so that the output frequency of the phase-locked loop can be varied without having to change the frequency of the reference signal. In FIG. 1, this divider is shown at 107. If the divide ratio is a constant N, then the loop forces the output signal to be exactly N times the reference signal frequency. In circuits of this type the divide ratio N can be changed in integer steps to change the frequency of the signal generator.

One limitation with this type of phase-locked loop is that the output frequency cannot be varied in steps any smaller than the reference frequency. This is because N can only have integer values, so that the smallest change in the output frequency that can be made is $1 \times F_{REF}$. Therefore, for fine frequency resolution, it is preferred to have a small reference frequency. However, due to mismatches in the phase-locked loop's charge pump and other factors such as the non-ideal behaviour of the PFDs, the charge pump tends to output small charge pulses that cause sidebands to appear in the output signal of the VCO, even when the phase-locked loop is locked. These sidebands appear at offsets equal to the reference frequency. Therefore, if the reference frequency is small, a narrower loop filter bandwidth is required to remove the sidebands. Phase-locked loops with narrower loop filter bandwidths take longer to transition from one frequency to another and may not operate at the required speed. Also, the narrower the loop filter's bandwidth, the less the VCO's phase noise is suppressed.

One way of achieving finer frequency resolution is to put a 1/M divider between the reference signal and the PFD. Another is to use a fractional-N divider. Fractional-N synthesis involves varying the division ratio periodically between two integer values, as shown in FIG. 2. The overall division ratio is then determined by N plus a fractional value determined by the time for which a division ratio of N+1 is used relative to a whole time period (i.e. the time for which a division ratio of N is used plus the time for which a division ratio of N+1 is used).

A problem with a fractional-N division architecture is that the modulation of the division ratio causes a huge transient voltage at the input to the VCO. To partially compensate for this effect, DAC compensation can be performed in parallel with the charge pump output. An example of a circuit using DAC compensation is shown in FIG. 3. FIG. 3 illustrates the PFD charge pump 301, the DAC charge pump 302, the loop filter 303 and the VCO 304. The deterministic jitter caused by the modulation of the division ratio is known in advance. The DAC charge pump typically generates a current that is the inverse of the error current caused by the modulation of the division ratio. This is then summed by the loop filter with the current output by the PFD charge pump.

For DAC compensation to successfully compensate for the phase error introduced into the feedback signal it is important that this compensation be as accurate as possible. One requirement for successful DAC compensation is that the duration of the current pulse output by the DAC charge pump be equal to one time period of the signal output by the VCO. This time period is likely to vary with time, especially when the phase-locked loop is not in its locked condition. There is a need for a phase-locked loop that can accurately generate current pulses having a predetermined duration equal to one time period of the VCO signal without adversely affecting the performance of the phase-locked loop.

According to a first embodiment of the invention, there is provided a phase-locked loop for generating an output signal that has a predetermined frequency relationship with a reference signal, the phase-locked loop comprising a signal generator arranged to generate the output signal, a charge pump arranged to generate current pulses for controlling the signal generator, two control units for controlling a duration of the current pulses generated by the charge pump and a selection unit arranged to select either the first control unit or the second control unit to control the charge pump, wherein a first one of the control units is arranged to continuously monitor a phase-difference between the reference signal and a feedback signal formed from the output signal and to, when selected by the selection unit, control the charge pump to output a current pulse having a duration that is dependent on that phase-difference and a second one of the control units is arranged to, when selected by the selection unit, control the charge pump to output a current pulse of predetermined duration that compensates for a phase error in the feedback signal.

The selection unit may be arranged to select the second control unit to control the charge pump once during each period of the reference signal.

The selection unit may be arranged to select the second control unit to control the charge pump only once during each period of the reference signal.

The selection circuit may be arranged to, each time that it selects the second control unit to control the charge pump, select the second control unit for a length of time that is at least equal to said predetermined duration.

The selection unit may be arranged to, when the second control unit is not selected, select the first control unit to control the charge pump.

The selection unit may comprise a multiplexor.

The first control unit may be arranged to control the charge pump to output a current pulse having a duration that is proportional to the phase difference between the reference signal and the feedback signal.

The first control unit may be arranged to receive the reference signal and the feedback signal and to output a control signal representative of a time difference between a first time at which the reference signal crosses a predetermined threshold in one direction and a second time at which the feedback signal crosses the predetermined threshold in that one direction.

The first control unit may be arranged to output a control signal comprising a voltage and/or current pulse having a duration that is dependent on said time difference.

The first control unit may be arranged to output a control signal comprising a voltage and/or current pulse having a duration that is proportional to said time difference.

The charge pump may be arranged to output a current pulse having a duration that is proportional to the duration of said voltage and/or current pulse.

The charge pump may comprise a plurality current sources and the first control unit is arranged to control a predetermined number of the plurality of current sources to generate a current having a duration that is dependent on the phase-difference between the reference and feedback signals.

The second control unit may be arranged to control the charge pump to output a current pulse of predetermined duration once during each period of the reference clock.

The second control unit may be arranged to, once during each period of the reference clock, control the charge pump to output a current pulse having a duration equal to one or more periods of the output signal during that period of the reference clock.

The phase-locked loop may comprise a delay line arranged to receive the reference signal and to, after an integer number of periods of the output signal of the phase-locked loop, output a signal having the same frequency as the reference signal that is delayed relative to the reference signal by a duration equal to the sum of the integer number of periods of the output signal of the phase-locked loop.

The second control unit may be arranged to receive first and second input signals having the same frequency as the reference signal, the first input signal leading the second input signal by one or more periods of the output signal of the phase-locked loop, wherein the second control unit is arranged to process the first and second input signals to form a control signal for the charge pump comprising a voltage and/or current pulse that has a duration equal to said one or more periods of the output signal of the phase-locked loop.

The second control unit may be arranged to form the control signal such that the voltage and/or current pulse has a duration that is dependent on a time difference between a first time at which the first input signal crosses a predetermined threshold in one direction and a second time at which the second input signal crosses the predetermined threshold in that one direction.

The second control unit may be arranged to form the control signal such that the duration of the voltage and/or current pulse is proportional to said time difference.

The charge pump may be arranged to output a current pulse having a duration that is proportional to the duration of said voltage and/or current pulse.

At least one of the first and second input signals may be formed by the delay line.

The phase-locked loop may comprise a divider arranged to receive the output signal and divide the output signal to form the feedback signal, the divider being arranged to vary the divisor by which the output signal is divided.

The second control unit may be capable of controlling the charge pump to output a current pulse that compensates for a phase error in the feedback signal caused by the variation of the divisor.

The charge pump may comprise a plurality of current sources and the phase-locked loop comprises a third control unit arranged to control a number of the plurality of current sources that is dependent on the variation of the divisor to output a current responsive to the second control unit.

The first and second control units may be phase-frequency detectors.

According to a second embodiment of the invention, there is provided a phase-locked loop for generating an output signal that has a predetermined frequency relationship with a reference signal, the phase-locked loop comprising a signal generator arranged to generate the output signal, a divider arranged to receive the output signal and divide the output signal to form a feedback signal, the divider being arranged to vary the divisor by which the output signal is divided, a comparison unit arranged to compare the feedback signal with the reference signal and a charge pump arranged to generate current pulses for controlling the signal generator in dependence on said comparison, the phase-locked loop being arranged such that when the comparison unit determines that the phase-locked loop is in a locked condition, the charge pump generates current pulses in dependence on an error in the feedback signal that is caused by the variation of the divisor and when the comparison unit determines that the phase-locked loop is not in the locked condition, the charge pump does not generate current pulses in dependence on an error in the feedback signal that is caused by the variation of the divisor.

The comparison unit may be arranged to control a duration of the current pulses generated by the charge pump, the comparison unit being capable of controlling the charge pump to output a current pulse having a duration that is dependent on the phase-difference between the reference signal and the feedback signal and of controlling the charge pump to output a current pulse having a predetermined duration that compensates for the phase error in the feedback signal caused by the variation of the divisor.

The comparison unit may be arranged to, when the phase-locked loop is in the locked condition during a first time period, monitor the phase-difference between the reference signal and the feedback signal and control the charge pump to output a current pulse having a duration that is dependent on that phase-difference and during a second time period, not monitor the phase-difference between the reference signal and the feedback signal and control the charge pump to output a current pulse having the predetermined duration that compensates for the phase error in the feedback signal caused by the variation of the divisor.

The comparison unit may be arranged to estimate a time period during which the phase-difference between the reference signal and the feedback signal can be detected and to commence controlling the charge pump to output a current pulse having the predetermined duration at a time such that the second time period during which that current pulse is generated does not overlap with the estimated time period.

The comparison unit may comprise a phase-locked loop arranged to output a current and/or voltage pulse either having a duration that is dependent on the phase-difference between the reference signal and the feedback signal or having a predetermined duration in dependence on one or more signals received at its inputs.

The comparison unit may be arranged to determine that the phase-locked loop is in the locked condition if the magnitude of a phase-difference between the reference signal and the feedback signal is determined by the comparison unit to have been below a predetermined threshold for a predetermined length of time.

For a better understanding of the present invention, reference is made by way of example to the following drawings, in which.

A phase-locked loop may generate an output signal that has a predetermined frequency relationship with a reference signal. The phase-locked loop may comprise a signal generator arranged to generate the output signal, a charge pump arranged to generate current pulses for controlling the signal generator and two control units for controlling a duration of the current pulses generated by the charge pump. One of the control units may be arranged to continuously monitor a phase-difference between the reference signal and a feedback signal formed from the output signal. This control unit may be capable of controlling the charge pump to output a current pulse having a duration that is dependent on that phase-difference. The other control unit may be capable of controlling the charge pump to output a current pulse of predetermined duration that compensates for a phase error in the feedback signal.

Figure 1:
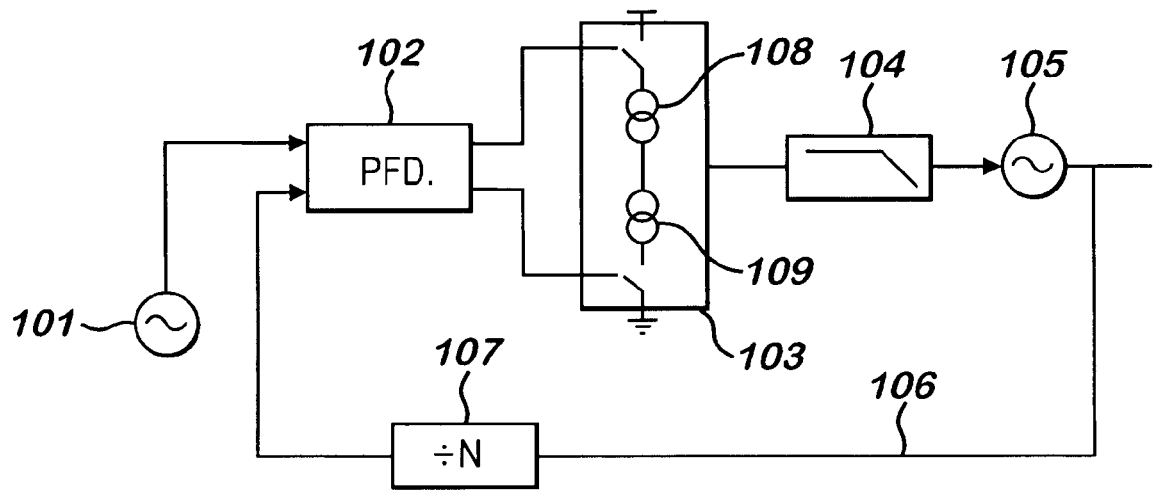
FIG. 1 shows a phase-locked loop.
Figure 2:
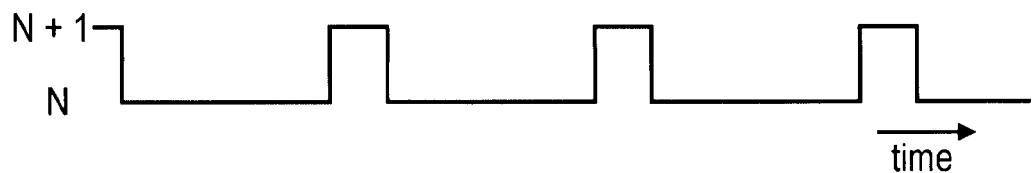
FIG. 2 shows the modulation of a division ratio for fractional-N division.
Figure 3:
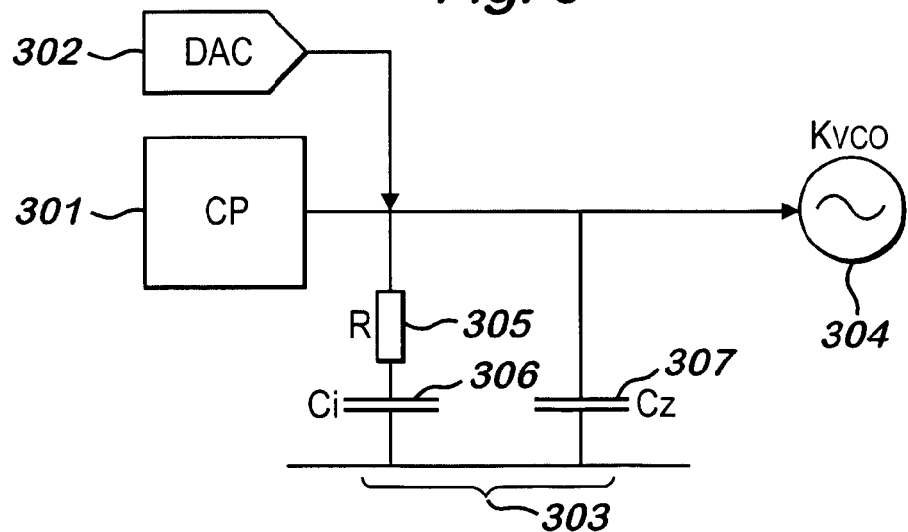
FIG. 3 shows a phase-locked loop incorporating DAC compensation.
Figure 4:
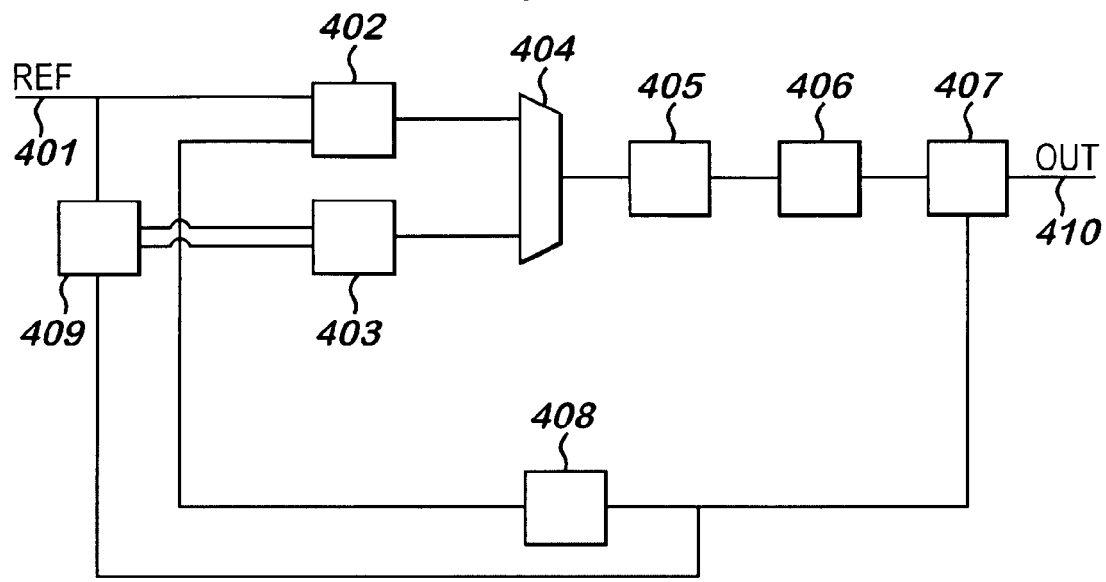
FIG. 4 shows a phase-locked loop for performing DAC compensation in both the locked and unlocked conditions.

An example of a phase-locked loop is shown in FIG. 4. The phase-locked loop receives a reference signal 401 at its input and outputs an output signal 410 having a predetermined frequency-relationship with the reference signal. Typically this relationship is a multiple relationship so that the frequency of the output signal is a static value times the frequency of the reference signal. The static value may be a non-integer.

The output signal of the phase-locked loop is generated by a signal generator 407. The signal generator is suitably a voltage-controlled oscillator but could be any component capable of generating a signal having a frequency that is dependent on a control signal applied to its input. The signal generator is controlled by a signal output by a loop filter 406, which is arranged to filter current pulses that are output by a charge pump 405. The charge pump is capable of generating current pulses in two directions. Pulses in the "up" direction have the effect of "speeding up" the signal generator so that it outputs a signal of higher frequency. Pulses in the "down" direction have the effect of "slowing down" the signal generator so that it outputs a signal of lower frequency. The amount by which the signal generator is speeded up or slowed down is dependent on the amount of charge introduced by the charge pump into the loop filter, i.e. it is dependent on both the duration and magnitude of the current pulses output by the charge pump. The charge pump is therefore controlled to output pulses of suitable direction, duration and magnitude in dependence on the relationship between the output frequency and the reference frequency.

The signal output by the signal generator is fed-back via a feedback loop which may include a divider 408. The divider determines the frequency relationship between the reference signal and the output signal. For example, if the divider divides the output frequency by N then the phase-locked loop will output a signal having a frequency that is N times the frequency of the reference signal. The divider may vary the divisor by which it divides the output signal between two or more integer values in order to achieve an output frequency that is a non-integer multiple of the reference frequency.

The phase-locked loop includes two control units 402, 403. These control units are capable of controlling the duration of the current pulses output by the charge pump. One of the control units 402 receives the reference signal and the feedback signal as input signals. This control unit monitors the phase-difference between the reference signal and the feedback signal and controls the charge pump to output current pulses having a duration that is dependent on this phase-difference (PFD compensation). The other control unit 403 controls the charge pump to output current pulses having a predetermined duration in dependence on a phase-error in the feedback signal. The predetermined duration may be one or more periods of the signal output by the signal generator. In the example of FIG. 4, the phase-error in the feedback signal is caused by the divider varying the division ratio. The control unit 403 is arranged to receive two input signals, both of which are generated by a processing unit 409 from the reference frequency 401 and the output of the phase-locked 410.

The variation of the division ratio causes a phase error in the feedback signal that results in a timing error in control unit 402 because an edge of the feedback signal occurs either earlier or later than it should do. Therefore, the current pulses output by the charge pump responsive to control unit 402 will contain an error charge that is equal to the timing error multiplied by the charge pump current. The timing error is a fraction of the time period of the signal output by the signal generator. Therefore, one option for compensating for the error charge would be to output a current pulse in the opposite direction to the error current and having a duration equal to the timing error and a current equal to the charge pump current. However, it is difficult to generate the required control signals for generating a current pulse having a duration equal to a fraction of a time period of the output signal. Therefore, a preferred option is to compensate for the error charge by means of a current pulse having a duration that is equal to one or more periods of the output signal and a magnitude that is dependent on the timing error.

in the example of FIG. 4, the phase-locked loop comprises only one charge pump for performing both PFD and DAC compensation. It can be difficult matching the behaviour of transistors and current sources in the charge pump, particularly their transient behaviour. Therefore, using the same components to perform both PFD and DAC compensation can be beneficial for reducing noise. Because only one charge pump is provided in the phase-locked loop of FIG. 4, the phase-locked loop also comprises a selection circuit 404 for selecting either the first control unit or the second control unit to control the charge pump. This selection circuit may be provided by a multiplexor. Another option would be to have two or more charge pumps, each controlled by a respective one of the control units, in which case a selection circuit may not be required.

The phase-locked loop may also comprise control means (not shown) for controlling when the selection unit selects the first control unit or the second control unit for controlling the charge pump.

The control units may both be phase-frequency detectors.

Figure 5:
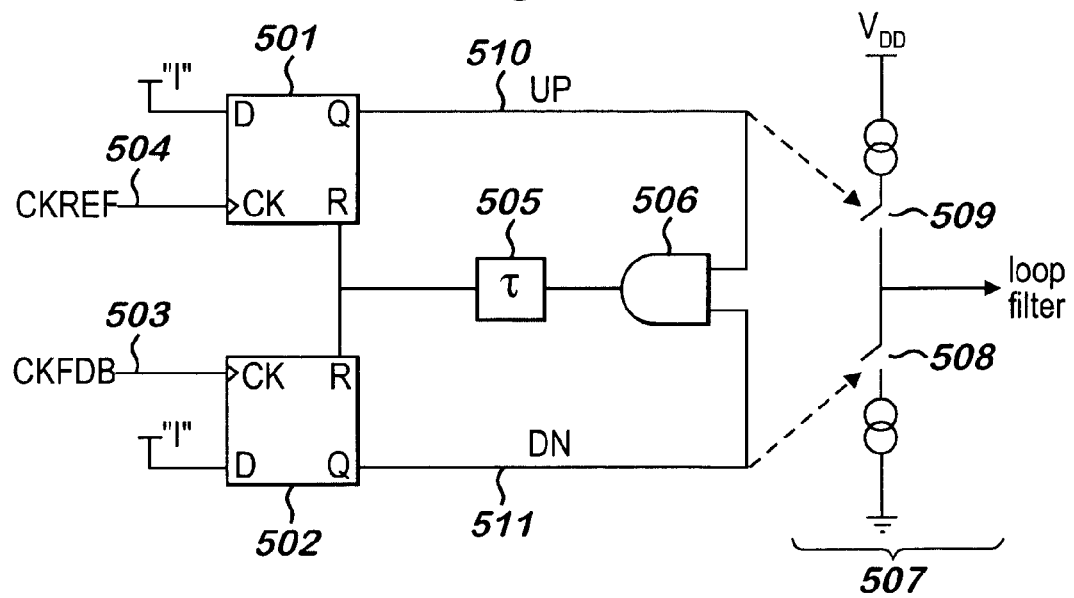
FIG. 5 shows a phase-frequency detector.

An example of a phase-frequency detector for implementing the first control unit is shown in FIG. 5. The PFD comprises two flip-flops 501, 502, which each have one input tied to logic one. The clock input of one flip-flop receives the reference signal 504 while the clock input of the other flip-flop receives the feedback signal 503. An output of each flip-flop is responsible for controlling current pulses generated in a particular direction by charge pump 507. So flip-flop 501 controls pulses in the "up" direction via path 510, which controls switch 509 in the charge pump, and flip-flop 502 controls pulses in the "down" direction via path 511, which controls switch 508 in the charge pump. Typically the switches 508 and 509 will close responsive to a voltage and/or current pulse output by the PFD. This pulse may be either "high" or "low", depending on how the switches are implemented. The duration and direction of charge pulses output by the charge pump is thus dependent on voltage and/or current pulses output by the PFD.

The PFD may output signal pulses having a duration that is proportional to the phase-difference between the reference signal and the feedback signal. The signal pulses may be voltage and/or current pulses. For example, if the reference signal is leading the feedback signal, path 510 will be pulled high by a rising edge of the reference signal before path 511 is pulled high by a rising edge of the feedback signal. The PFD therefore outputs a voltage/current pulse that causes the charge pump to output a current pulse in the "up" direction. A rising edge of the feedback signal then causes the flip-flops to be reset by AND gate 506, which terminates the voltage/current pulse output by the PFD. Switch 509 then opens so that the charge pump is no longer generating current. Therefore, the duration of the "up" pulse generated by the charge pump is equal to the time that elapses between the rising edges of the reference signal and the feedback signal, so that the amount of charge transferred to the loop filter is proportional to the phase-difference between the reference and feedback signals. The same principle applies to generating "down" pulses when the reference signal lags the feedback signal.

The PFD also includes a delay unit 505 to delay the reset signal. The reason for delaying the reset signal is to account for delays in the response of the charge pump, e.g. due to the switching time of the charge pump currents which may be a function of the charge pump currents and the load capacitance of transistor switches in the charge pump. The delay provided by the delay unit should preferably be longer than the switching time of the charge pump currents.

If the second control unit is for controlling the charge pump to perform DAC compensation, so as to compensate for an error in the feedback signal due to modulation of the division ratio, the control unit suitably controls the charge pump to output a current pulse having a duration equal to one time period of the output signal or multiple time periods of the output signal. This can be achieved by having the second control unit output a signal having either a "high" or "low" voltage/current pulse (depending on how the charge pump switches are activated) with a duration equal to one or more time periods of the output signal. Suitably this voltage/current pulse is output once in every time period of the reference signal, so that DAC compensation is performed once in every time period of the reference signal.

Figure 6:
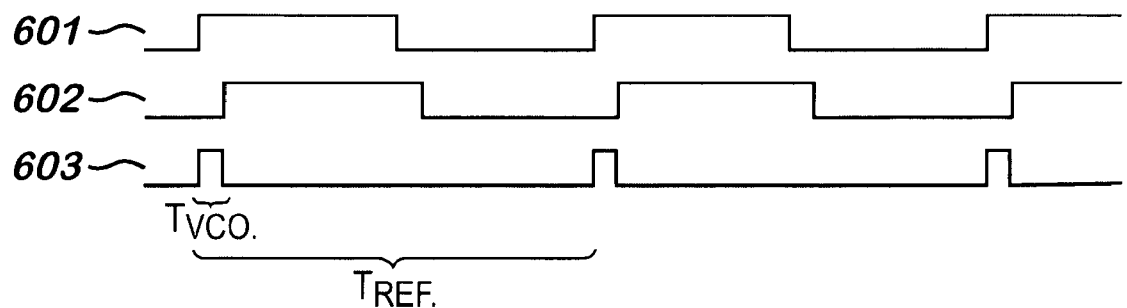
FIG. 6 shows signals for controlling the second control unit and the charge pump.

If the second control unit is a PFD, the required voltage/current pulse can be generated by inputting two versions of the reference signal to the PFD with one input signal leading the other by one period of the output signal. FIG. 6 shows two such signals at 601 and 602. If these signals are input into a PFD, such as the one illustrated in FIG. 5, then signal 603 will result. Signal 603 contains the required pulse having a duration of one VCO period and occurring once every reference period. If pulses having a duration equal to an integer number of VCO periods are required, then one of the input signals suitably leads the other by that integer number of VCO periods.

Figure 7:
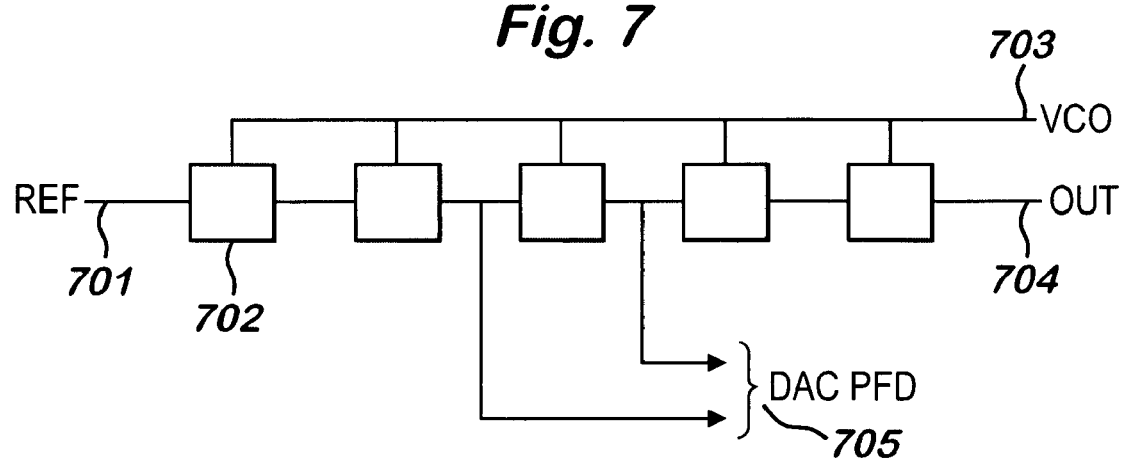
FIG. 7 shows a delay line.

The signals for inputting to the second control unit may be generated by a processing unit, such as processing unit 409 shown in FIG. 4. This processing unit may comprise a delay line such as that shown in FIG. 7. The delay line is arranged to receive the reference signal 701 and to pass the reference signal through a succession of delay units 702 at each rising edge of the clock, which is provided by the VCO output 703. The output signal 704 therefore has an identical frequency to the reference signal but is delayed relative to the reference signal. The time by which the output lags the reference signal depends on the number of delay units through which the reference signal has been clocked and the time period of the VCO signal (which may change as the charge pump outputs current pulses for adjusting the VCO). The total delay of the output signal relative to the reference signal is therefore equal to the sum of the number of time periods of the VCO signal that have elapsed since it entered the delay line.

As the DAC current pulses generated by the charge pump are of predetermined duration, the amount of error introduced into the feedback signal by the modulation of the division ratio may be accounted for by adjusting the magnitude of the current pulses. Therefore, the charge pump is suitably controlled to output charge pulses having a magnitude that is dependent on the error introduced into the feedback signal by varying the divisor used to form the feedback signal. The phase-locked loop may comprise a third control unit arranged to control the magnitude of the current pulses output by the charge pump. The phase error caused by modulating the division ratio may, for example, be determined from the overflow of a counter or the output of a sigma-delta modulator used to dither the division ratio between two or more integer values.

Both the first and second control units may be implemented using an identical phase-frequency detector. Therefore, the same phase-frequency detector could be used to control the charge pump for PFD compensation as is used to control the charge pump for DAC compensation. However, this can be problematic because it introduces into the phase-locked loop periods of time for which the PFD is not "listening" to the reference and feedback signals because it is generating the pulses of predetermined length required for DAC compensation. This introduces dead-zones into the response of the PFD that may prevent the phase-locked loop from locking.

Figure 8A:
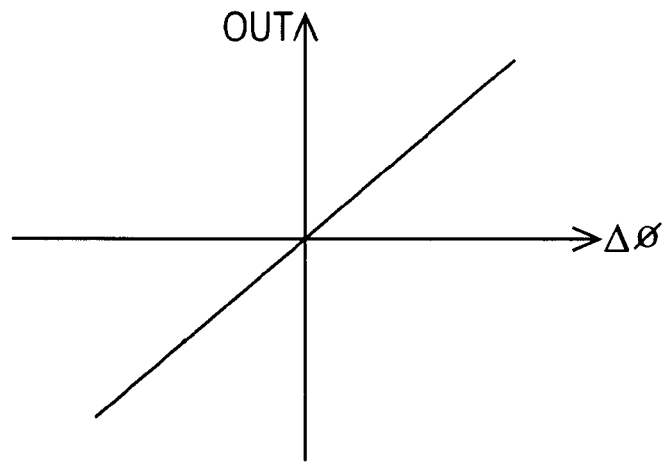
FIGS. 8a to 8c show behaviour of a phase-locked loops suffering from dead-zones.

An ideal PFD/charge pump combination provides an output that has a continuous, linear relationship with the phase-difference between the reference and feedback signals, as shown in FIG. 8a. However, if the PFD has time periods when it performs DAC compensation and is thus not monitoring the reference and feedback signals there will be some phase-differences that the PFD will not detect correctly. For example, if the PFD misses the rising edges of both the reference signal and the feedback signal, the PFD will be unable to detect the phase-difference between those signals.

Figure 8B:
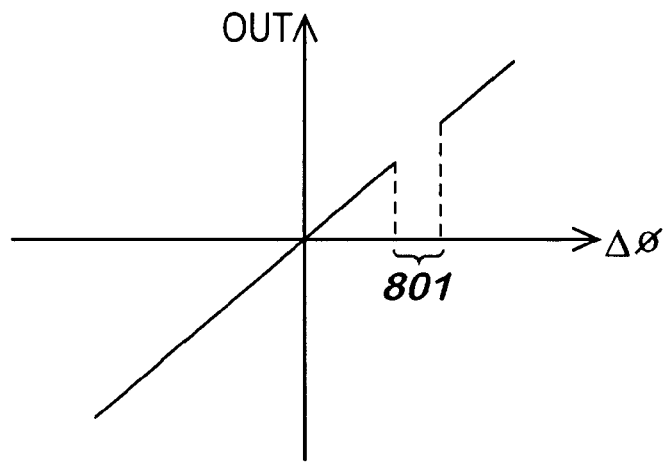

If the PFD misses one of the rising edges of the reference signal or the feedback signal, the PFD may determine that the phase-difference to be different in size and direction from what it actually is. This is shown as dead-zone 802 in FIG. 8*b* and it can be so severe as to create an "inescapable trap", i.e. regions from which the phase-locked loop will not be able to reach a lock condition.

Figure 8C:
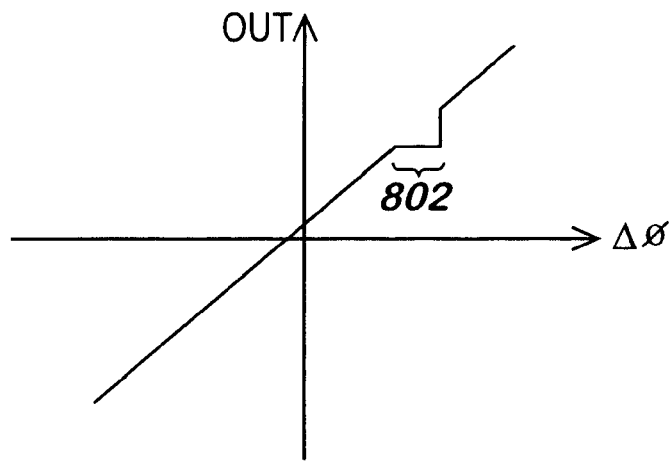

Therefore, it may be advantageous to use two control units: one of which is responsible for PFD compensation and the other of which is responsible for DAC compensation. This means that one control unit can continuously monitor the reference and feedback signals so that no events are missed. Thus, when the first control unit is switched-out from controlling the charge pump so that DAC compensation can be performed by the second control unit, the first control unit continues to receive the reference and feedback signals and update its state machine accordingly. This means that when the first control unit is once again switched-in to controlling the charge pump, the state machine is in the correct state so that locking of the phase-locked loop is guaranteed. This is shown in FIG. 8*c*, from which it can be seen that although the output of the charge pump may not be the ideal linear relationship shown in FIG. 8*a* (because there are some phase-differences for which a charge pump current is not output due to performing DAC compensation 802), the inescapable trap of FIG. 8*b* has been avoided.

It is possible to configure the timing of when the PFD switches to performing DAC compensation so as to avoid missing rising edges of the reference or feedback signals. However, this is not a strategy that can be used to guarantee locking because when not locked it is difficult to predict when a rising edge of the feedback signal might occur and therefore where the dead-zone may be safely located. However, although this strategy cannot guarantee locking, it may nonetheless be beneficial to keep even the reduced dead-zone of FIG. 8*c* as far from the locked-condition (i.e. the central axis of FIG. 8*c*) as possible so that during the locked-condition the zone 802 of reduced sensitivity is not encountered.

Figure 9:
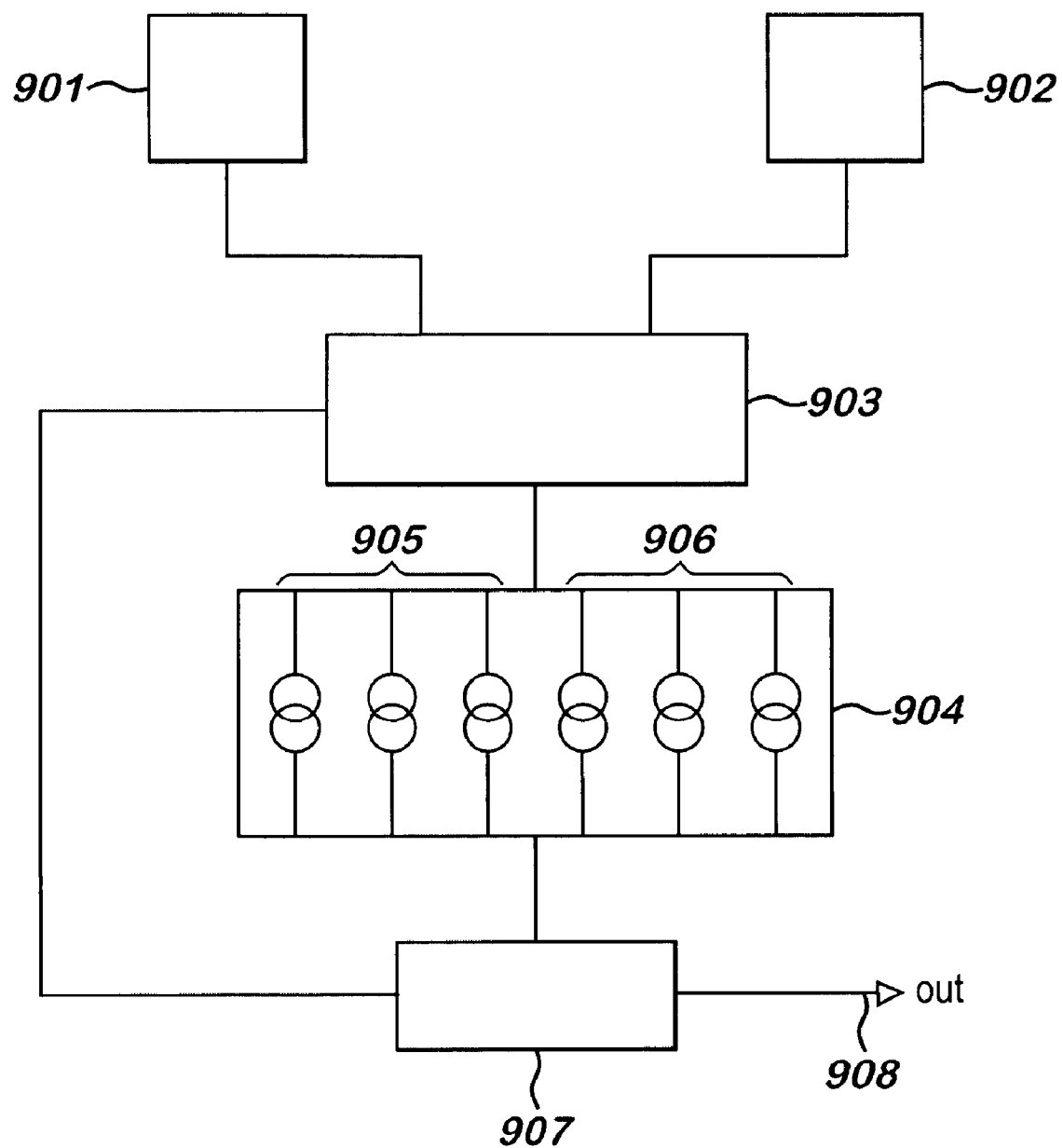
FIG. 9 shows a charge pump having multiple current sources.

FIG. 9 shows an example of a charge pump that might be controlled by the control units described above. FIG. 9 shows a control means 903 that is arranged to receive input signals from first and second control units 901, 902. Suitably the control means comprises the selection circuit shown in FIG. 4 and is thus arranged to select which of the first and second control units controls the duration of charge pulses output by the charge pump at any given time. The first control unit may suitably be a PFD that is arranged to detect a phase difference between the reference signal and the feedback signal of a phase-locked loop. The second control unit may also be a PFD, but this time arranged to generate pulses of predetermined duration for controlling current sources of the charge pump to generate a current for that predetermined duration.

The current sources 904 are arranged to generate a current in dependence on a control input received from the control unit. The sum of the currents generated by the current sources is received by a summation unit 907, which may suitably be a capacitive element. The summation unit generates the output signal 908, which may be for injecting charge into a loop filter of a phase-locked loop.

The current sources may be arranged into two groups 905, 906. A first group 905 may be arranged to generate "up" current pulses. A second group 906 may be arranged to generate "down" current pulses. Often PFD and DAC compensation requires that current pulses be generated in opposite directions, particularly in the locked condition when theoretically the phase-difference between the reference and feedback signals is equal to the phase error caused by modulating the division ratio. Therefore, it will frequently occur that one group of current sources will used to generate the current pulses for PFD compensation followed by the other group of current sources generating pulses for DAC compensation.

The control unit may be arranged to control the current sources such that a two-part compensation process is performed. PFD compensation and DAC compensation may be performed separately (e.g. consecutively). The first group of current sources may first be controlled to generate a current dependent on a signal received from the first control unit. A predetermined time after the VCO clock, the second group of current sources may be controlled to generate a current in dependence on the signal received from the second control unit. These two current generation processes may be non-overlapping in time. However, as the first and second control units function independently, it may be that two forms of compensation can overlap in time even when the same charge pump is used provided that different current sources are used for each form of compensation.

The control means may control the current sources to generate the required currents during a first time period. During this first time period, the currents generated by the individual current sources are received by the summation unit. During the second time period, the summation unit forms an output current that is dependent on the currents it received during the first time period.

Typically, PFD compensation may be performed by generating current pulses of predetermined value but variable duration. Therefore, the control unit may be arranged to perform PFD compensation by controlling a predetermined or fixed number of the current sources (e.g. all of the current sources in the first or second group) to generate a current for a length of time that is dependent on the signal received from the phase-frequency detector.

Typically, DAC compensation may be performed by generating current pulses of predetermined duration but variable value. Therefore, the control unit may be arranged to perform DAC compensation by controlling a variable number of current sources to generate current for a predetermined or fixed length of time. The number of current sources arranged to generate a current may be dependent on a signal received from the divider in the feedback loop that indicates how the division ratio has been modulated.

In one embodiment, the control means may comprise a demultiplexor for controlling the DAC current sources. A DAC code received by the control means, or generated by the control means from information received from the divider, may be input into the demultiplexor to activate the required number of current sources for a predetermined length of time.

The control means may comprise a switching arrangement for "rotating" the current sources between the "up" and "down" groups at each clock period. The current sources may be rotated either individually or in a block. This rotation may help to reduce noise because it enables any errors in "up" or "down" pulses caused by individual ones of the current sources to be evened out over time.

As mentioned above, the dead-zone caused by not listening to the reference and feedback signals when performing DAC compensation can be especially problematic when the phase-locked loop has not locked. However, when the phase-locked loop has locked, it may be possible to perform both types of compensation by means of the same PFD if the DAC compensation is timed appropriately. Therefore, a phase-locked loop may be arranged to switch-in the DAC compensation only when the loop has reached a lock condition.

A phase-locked loop may be arranged to generate an output signal that has a predetermined frequency relationship with a reference signal. The phase-locked loop may comprise a signal generator arranged to generate the output signal. The phase-locked loop may also comprise a divider arranged to receive the output signal and divide the output signal to form a feedback signal. The divider may vary the divisor by which the output signal is divided. For example, the divider may vary the divisor between two or more integer values in such a way that the frequency of the output signal is a non-integer multiple of the reference frequency.

The phase-locked loop may also comprise a comparison unit arranged to compare the feedback signal with the reference signal and a charge pump arranged to generate current pulses for controlling the signal generator in dependence on the comparison performed by the comparison unit. When the comparison unit determines that the phase-locked loop is in a locked condition, the charge pump may generate current pulses dependent on an error in the feedback signal that is caused by the variation of the divisor. When the comparison unit determines that the phase-locked loop is not in the locked condition, the charge pump may not generate current pulses dependent on an error in the feedback signal that is caused by the variation of the divisor. Therefore, the phase-locked loop may be arranged so that DAC compensation is performed only when the phase-locked loop is in the locked condition.

The phase-locked loop may be considered to be in a locked condition when the frequency of the output signal is such that its relationship with the reference signal is within an acceptable tolerance of being the predetermined relationship that the phase-locked loop is trying to achieve. The comparison unit may determine that the phase-locked loop has locked if has measured the magnitude of the phase-difference between the reference signal and the feedback signal to have been below a predetermined threshold for a predetermined length of time. This threshold may be dependent on the modulation of the division ratio since in an ideal locked condition the only phase-difference between the reference signal and the feedback signal would be that resulting from the modulation of the division ratio.

Figure 10:
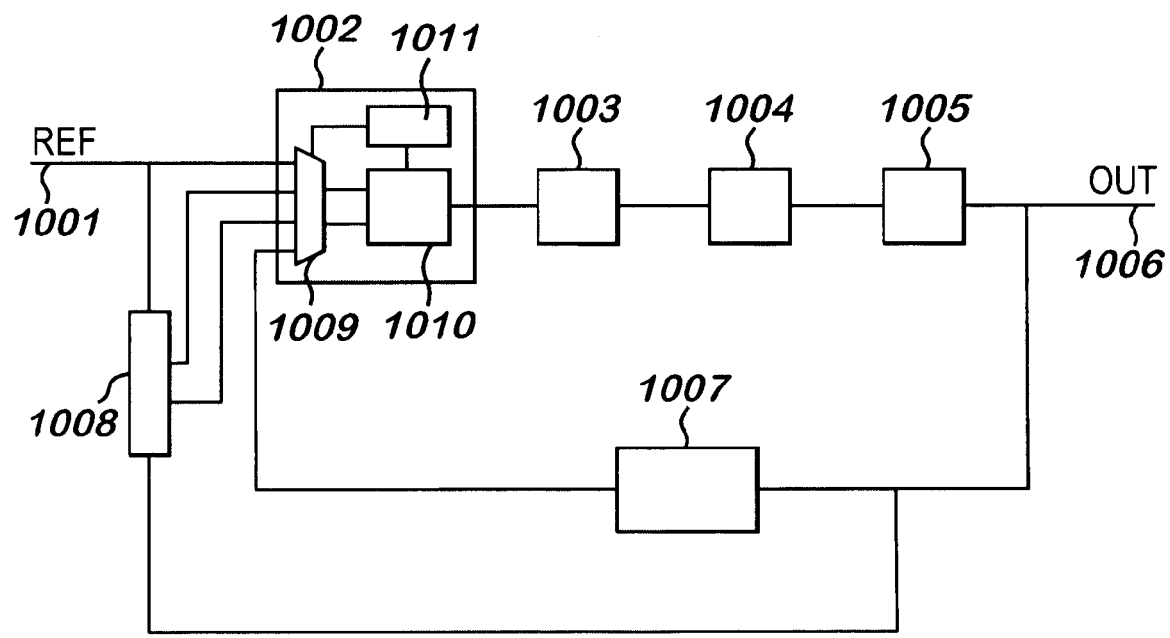
FIG. 10 shows a phase-locked loop for performing DAC compensation only in the locked condition.

An example of a phase-locked loop that performs DAC compensation only in the locked condition is shown in FIG. 10. The phase-locked loop comprises a comparison unit 1002 arranged to receive a reference signal 1001, a charge pump controlled by the comparison unit 1003, a loop filter 1004 for filtering the current pulses output by the charge pump and a signal generator 1005 for receiving a control signal from the loop filter and generating an output signal 1006 in dependence on that signal. The output signal is fed back through a divider 1007 to form a feedback signal that is received by the comparison unit. The phase-locked loop also comprises a processing unit 1008, which is similar to processing unit 409 of the phase-locked loop shown in FIG. 4 and may suitably be a delay line.

The comparison unit comprises two control units 1010, 1011. A first one of these control units 1010 is arranged to control the charge pump to generate current pulses either in dependence on the phase-difference between the reference signal and the feedback signal or in dependence on a phase error in the feedback signal caused by modulation of the division ratio. This control unit may be a PFD, such as the PFDs described above. The signal output by the PFD is dependent on which two signals it receives at its inputs. This may be controlled by selection circuit 1009, which either selects the reference signal and the feedback signal for inputting to the PFD (for PFD compensation) or the signals output by the delay line (for DAC compensation). The selection circuit may be a multiplexor. The PFD is permanently connected to the charge pump so that the current pulses output by the charge pump are dependent on which two signals are being input into the PFD. The operation of the PFD is thus as has been described above, with the only difference being that in this example only a single PFD is used to generate both of the required signal types for controlling the duration of current pulses output by the charge pump.

The second control unit 1011 is arranged to control the selection circuit. Initially the phase-locked loop is not in the locked condition so the second control unit controls the selection circuit to select the reference signal and the feedback signal for being input into the PFD. The second control unit determines from information received from the PFD when the phase-locked loop is in the locked condition. When a locked condition is detected, DAC compensation can be performed. The second control unit is then responsible for controlling when during each time period of the reference signal DAC compensation is performed. Since the phase-locked loop is in the locked condition, the second control unit may be able to determine approximately when during each cycle it is necessary to listen to the reference and feedback signals if the phase difference between them is to be determined from their rising edges. The second control unit may use information on the modulation of the division ratio to make this determination. Having made this determination, the second control unit can then control the selection circuit to switch the signals input to the PFD from the reference signal and the feedback signal to the signals output from the delay line at an appropriate time during the reference period. The second control unit thus controls the PFD and charge pump to perform a two-stage compensation process in the locked condition, with PFD compensation being performed during one time period and PFD compensation being performed during a consecutive, non-overlapping time period.

The phase-locked loop shown in FIG. 10 thus provides similar advantages to the phase-locked loop shown in FIG. 4 in that it provides guaranteed locking. In the phase-locked loop of FIG. 10 this guaranteed locking is achieved with only a single PFD. However, in order to provide guaranteed locking, the phase-locked loop of FIG. 10 does not perform DAC compensation during the locking phase.

Estimating the time period during which the phase-difference between the reference and feedback signal is likely to be detectable and timing the DAC compensation accordingly may also be advantageous in a phase-locked loop comprising a control unit that continuously monitors the reference and feedback signals. A control means may be provided for this purpose in the phase-locked loop of FIG. 4.

The above description has focussed on examples in which the purpose of the current pulses of predetermined duration output by the charge pump is for DAC compensation. However, the phase-locked loop described herein is not limited to any specific type of compensation and the same techniques may be applied to compensate for other errors in the feedback signal.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The invention claimed is:

1. A phase-locked loop for generating an output signal that has a predetermined frequency relationship with a reference signal, the phase-locked loop comprising a signal generator arranged to generate the output signal, a charge pump arranged to generate current pulses for controlling the signal generator, two control units for controlling a duration of the current pulses generated by the charge pump and a selection unit arranged to select either the first control unit or the second control unit to control the charge pump, wherein:
   a first one of the control units is arranged to continuously monitor a phase difference between the reference signal and a feedback signal formed by a divider from the output signal and to, when selected by the selection unit, control the charge pump to output a current pulse having a duration that is dependent on that phase difference; and
   a second one of the control units is arranged to, when selected by the selection unit, control the charge pump to output a current pulse of duration equal to one or more time periods of the output signal to compensate for a phase error in the feedback signal caused by varying the divisor by which the divider divides the output signal.

2. A phase-locked loop as claimed in claim 1, wherein the selection unit is arranged to select the second control unit to control the charge pump once during each period of the reference signal.

3. A phase-locked loop as claimed in claim 1, wherein the selection unit is arranged to select the second control unit to control the charge pump only once during each period of the reference signal.

4. A phase-locked loop as claimed in claim 1, wherein the selection circuit is arranged to, each time that it selects the second control unit to control the charge pump, select the second control unit for a length of time that is at least equal to said duration equal to one or more time periods of the output signal.

5. A phase-locked loop as claimed in claim 1, wherein the selection unit is arranged to, when the second control unit is not selected, select the first control unit to control the charge pump.

6. A phase-locked loop as claimed in claim 1, wherein the selection unit comprises a multiplexor.

7. A phase-locked loop as claimed in claim 1, wherein the first control unit is arranged to control the charge pump to output a current pulse having a duration that is proportional to the phase difference between the reference signal and the feedback signal.

8. A phase-locked loop as claimed in claim 1, wherein the first control unit is arranged to receive the reference signal and the feedback signal and to output a control signal representative of a time difference between a first time at which the reference signal crosses a predetermined threshold in one direction and a second time at which the feedback signal crosses the predetermined threshold in that one direction.

9. A phase-locked loop as claimed in claim 8, wherein the first control unit is arranged to output a control signal comprising a voltage and/or current pulse having a duration that is dependent on said time difference.

10. A phase-locked loop as claimed in claim 9, wherein the first control unit is arranged to output a control signal comprising a voltage and/or current pulse having a duration that is proportional to said time difference.

11. A phase-locked loop as claimed in claim 9, wherein the charge pump is arranged to output a current pulse having a duration that is proportional to the duration of said voltage and/or current pulse.

12. A phase-locked loop as claimed in claim 1, wherein the charge pump comprises a plurality current sources and the first control unit is arranged to control a predetermined number of the plurality of current sources to generate a current having a duration that is dependent on the phase difference between the reference and feedback signals.

13. A phase-locked loop as claimed in claim 1, wherein the second control unit is arranged to control the charge pump to output said current pulse of said duration equal to one or more time periods of the output signal once during each period of the reference clock.

14. A phase-locked loop as claimed in claim 1, wherein the phase-locked loop comprises a delay line arranged to receive the reference signal and to, after an integer number of periods of the output signal of the phase-locked loop, output a signal having the same frequency as the reference signal that is delayed relative to the reference signal by a duration equal to the sum of the integer number of periods of the output signal of the phase-locked loop.

15. A phase-locked loop as claimed in claim 1, wherein the second control unit is arranged to receive first and second input signals having the same frequency as the reference signal, the first input signal leading the second input signal by one or more periods of the output signal of the phase-locked loop, wherein the second control unit is arranged to process the first and second input signals to form a control signal for the charge pump comprising a voltage and/or current pulse that has a duration equal to said one or more periods of the output signal of the phase-locked loop.

16. A phase-locked loop as claimed in claim 15, wherein the second control unit is arranged to form the control signal such that the voltage and/or current pulse has a duration that is dependent on a time difference between a first time at which the first input signal crosses a predetermined threshold in one direction and a second time at which the second input signal crosses the predetermined threshold in that one direction.

17. A phase-locked loop as claimed in claim 16, wherein the second control unit is arranged to form the control signal such that the duration of the voltage and/or current pulse is proportional to said time difference.

18. A phase-locked loop as claimed in claim 15, wherein at least one of the first and second input signals is formed by the delay line.

19. A phase-locked loop as claimed in claim 1, wherein the phase-locked loop comprises a divider arranged to receive the output signal and divide the output signal to form the feedback signal, the divider being arranged to vary the divisor by which the output signal is divided.

20. A phase-locked loop as claimed in claim 19, wherein the charge pump comprises a plurality of current sources and the phase-locked loop comprises a third control unit arranged to control a number of the plurality of current sources that is dependent on the variation of the divisor to output a current responsive to the second control unit.

21. A phase-locked loop as claimed in claim 1, wherein the first and second control units are phase-frequency detectors.

22. A phase-locked loop for generating an output signal that has a predetermined frequency relationship with a reference signal, the phase-locked loop comprising a signal generator arranged to generate the output signal, a divider arranged to receive the output signal and divide the output signal to form a feedback signal from the output signal, the divider being arranged to vary the divisor by which the output signal is divided, a charge pump comprising a plurality of current sources and arranged to generate current pulses for controlling the signal generator, two control units for controlling a duration of the current pulses generated by the charge pump and a selection unit arranged to select either the first control unit or the second control unit to control the charge pump, wherein:

a first one of the control units is arranged to continuously monitor a phase difference between the reference signal and the feedback signal and to, when selected by the selection unit, control the charge pump to output a current pulse having a duration that is dependent on that phase difference; and a second one of the control units is arranged to, when selected by the selection unit, control the charge pump to output a current pulse of duration equal to one or more time periods of the output signal to compensate for a phase error in the feedback signal, wherein the phase locked loop further comprises a third control unit arranged to control a number of the plurality of current sources that is dependent on the variation of the divisor to output a current responsive to the second control unit.

* * * * *